US009251015B2

United States Patent
Yim et al.

(10) Patent No.: US 9,251,015 B2
(45) Date of Patent: Feb. 2, 2016

(54) MEMORY SYSTEM PROVIDING WEAR-LEVELING BY ALLOCATING MEMORY BLOCKS AMONG GROUPS

(71) Applicants: Yong-Tae Yim, Suwon-si (KR); Sung-Kue Jo, Yongin-si (KR)

(72) Inventors: Yong-Tae Yim, Suwon-si (KR); Sung-Kue Jo, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/273,901

(22) Filed: May 9, 2014

(65) Prior Publication Data

US 2014/0245109 A1     Aug. 28, 2014

Related U.S. Application Data

(62) Division of application No. 12/230,769, filed on Sep. 4, 2008.

(30) Foreign Application Priority Data

Sep. 13, 2007  (KR) .................. 10-2007-0093173

(51) Int. Cl.
| | |
|---|---|
| G06F 11/16 | (2006.01) |
| G11C 16/34 | (2006.01) |
| G06F 12/02 | (2006.01) |
| G06F 3/06 | (2006.01) |

(52) U.S. Cl.
CPC ........ *G06F 11/1658* (2013.01); *G06F 12/0246* (2013.01); *G11C 16/3495* (2013.01); *G06F 3/0616* (2013.01); *G06F 3/0619* (2013.01); *G06F 2212/1032* (2013.01); *G06F 2212/7211* (2013.01); *G11C 16/349* (2013.01)

(58) Field of Classification Search
CPC  G11C 16/349; G11C 16/3495; G06F 3/0614; G06F 3/0616; G06F 3/0617; G06F 3/0619; G06F 11/1658
See application file for complete search history.

(56) References Cited

U.S. PATENT DOCUMENTS

| | | |
|---|---|---|
| 5,475,693 A | 12/1995 | Christopherson et al. |
| 6,374,381 B1 | 4/2002 | Moriya |
| 6,993,690 B1 * | 1/2006 | Okamoto ............... 714/718 |
| 7,168,010 B2 | 1/2007 | Yadavalli et al. |

(Continued)

FOREIGN PATENT DOCUMENTS

| | | |
|---|---|---|
| CN | 1118830 C | 8/2003 |
| JP | 11-272567 | 10/1999 |

(Continued)

OTHER PUBLICATIONS

Wikipedia's Solid-State Drive historical version from Sep. 3, 2008 http://en.wikipedia.org/w/index.php?title=Solid-state_drive&oldid=235932410.*

*Primary Examiner* — Joseph Schell
(74) *Attorney, Agent, or Firm* — Harness, Dickey & Pierce, P.L.C.

(57) ABSTRACT

Provided is a memory system and wear-leveling method. A memory system includes a flash memory device and a memory controller. The flash memory device includes a plurality of memory blocks, each including a plurality of memory cells. The memory controller is configured to control the flash memory device based on erase event information and error checking and correction (ECC) event information of each of the memory blocks such that use of the memory blocks is distributed more uniformly.

18 Claims, 4 Drawing Sheets

(56) References Cited

U.S. PATENT DOCUMENTS

| | | |
|---|---|---|
| 7,493,534 B2 | 2/2009 | Pomaranski et al. |
| 7,506,098 B2 | 3/2009 | Arcedera et al. |
| 7,849,275 B2 * | 12/2010 | Danilak ............... G06F 11/008 |
| | | 711/154 |
| 9,063,181 B2 * | 6/2015 | Banker ............. G01R 19/2513 |
| 2003/0225961 A1 | 12/2003 | Chow et al. |
| 2004/0177212 A1 | 9/2004 | Chang et al. |
| 2004/0187052 A1 | 9/2004 | Shiota et al. |
| 2005/0024978 A1 * | 2/2005 | Ronen .......................... 365/232 |
| 2005/0204187 A1 | 9/2005 | Lee et al. |
| 2005/0281088 A1 | 12/2005 | Ishidoshiro et al. |
| 2006/0117214 A1 | 6/2006 | Sugiura et al. |
| 2007/0214395 A1 | 9/2007 | Shiota et al. |
| 2007/0266200 A1 * | 11/2007 | Gorobets et al. ............. 711/103 |
| 2008/0163014 A1 | 7/2008 | Crawford et al. |
| 2008/0288814 A1 * | 11/2008 | Kitahara ........................... 714/5 |
| 2008/0301525 A1 | 12/2008 | Hirose et al. |
| 2008/0307270 A1 * | 12/2008 | Li .................................. 714/47 |
| 2010/0161880 A1 * | 6/2010 | You ............................... 711/103 |
| 2010/0230807 A1 * | 9/2010 | Bronner et al. ............... 257/734 |

FOREIGN PATENT DOCUMENTS

| | | |
|---|---|---|
| JP | 2003-308242 A | 10/2003 |
| JP | 2004-280556 A | 10/2004 |
| JP | 2005-196634 A | 7/2005 |
| JP | 2005-528696 A | 9/2005 |
| JP | 2006-134482 A | 5/2006 |
| JP | 2006-221334 A | 8/2006 |
| JP | 2008-299621 A | 12/2008 |
| KR | 2002-0028624 A | 4/2002 |
| KR | 2004-0038711 A | 5/2004 |
| KR | 2005-0079991 A | 8/2005 |

* cited by examiner

MEMORY SYSTEM PROVIDING WEAR-LEVELING BY ALLOCATING MEMORY BLOCKS AMONG GROUPS

PRIORITY STATEMENT

This application is a Divisional application of U.S. patent application Ser. No. 12/230,769, filed Sep. 4, 2008, which claims priority under 35 U.S.C. §119 to Korean Patent Application No. 10-2007-0093173, filed on Sep. 13, 2007, the entire contents of all of which are incorporated herein by reference.

BACKGROUND

1. Field

Example embodiments relate to storage systems (e.g., memory systems using flash memory devices).

2. Description of Conventional Art

Electrically erasable programmable read only memory (EEPROM) is a type of memory device that allows memory blocks to be erased and programmed repetitively and simultaneously. One example EEPROM is flash memory. A conventional flash memory permits a region of memory blocks to be simultaneously programmed and/or erased through a single operation. However, the memory blocks in a conventional flash memory device may deteriorate (wear out) rendering them inoperable. For example, each memory block in a conventional flash device has a charge storage element. This charge storage element is surrounded by an insulation layer. Repetitive use of a memory block may wear out the insulation layer and render the memory block inoperable.

Conventional flash memory devices may store information on one or more silicon chip(s). The stored information may remain on the silicon chip regardless of power consumption and irrespective of a power supply. Additionally, the flash memory device may provide physical impact resistance and faster read access time. Due to these characteristics, a conventional flash memory device may be used as a storage device powered by an outside (external) source (e.g., battery powered). A flash memory device may be classified as a NOR flash memory device or a NAND flash memory device according to logic gate types used in the storage devices.

A conventional flash memory device may store information in an array of transistors (referred to as cells), each of which stores 1-bit of information. Multi-level cell devices store more than 1-bit per cell by varying the charge applied to the floating gate of the cell.

A concern in the use of conventional flash memory is the durability and reliability of memory blocks. Reliability may be determined by the ability of memory blocks to retain data. Durability may be determined by the number of programming/erasing cycles a memory block may bear without quality deterioration. A memory block that is no longer reliable and/or durable is known as a "bad block."

Bad blocks may occur for a variety of reasons. For example, stored charges (electrons) may leak from a floating gate due to various failures (e.g., thermo-ionic emission and charge diffusion through a defect inter-poly insulation layer; ion impurities; program disturb stress; etc.). This may cause a decrease in a threshold voltage. Furthermore, the opposite effect, charge acquisition, may occur if a floating gate obtains charges relatively slowly while maintaining a control gate at a power supply voltage. This causes an increase in a threshold voltage. In addition, repetitive programming/erasing cycles may cause stresses on an oxide layer of a memory transistor. This may lead to failures such as the breakdown of a tunnel oxide layer in the flash memory device.

In a conventional flash memory device, the possibility of a bad block is further enhanced by aging and deterioration phenomena when the number of the programming/erasing cycles reaches about 10K.

To address such concerns, some conventional wear-leveling methods use entire memory blocks of the flash memory device more uniformly. For example, a conventional form of wear-leveling maps the memory blocks and uses each block in a linear fashion. In this manner, a memory block is not reused until all other memory blocks have been previously used. However, this may cause deterioration in system performance since some memory blocks may be more prone to errors than others over a period of erasing and programming cycles.

SUMMARY

Example embodiments provide memory systems capable of improving reliability and/or wear-leveling methods thereof.

In an example embodiment, a memory system may include a flash memory device and a memory controller. The flash device may include a plurality of memory blocks. Each of the plurality of memory blocks may include at least one memory cell. The memory controller may be configured to control the flash memory device such that use of the memory blocks is distributed based on erasures of the memory blocks and errors in data stored in the memory blocks. The flash memory device and the memory controller may constitute a memory card.

According to example embodiments, the memory controller may be configured to distribute use of the memory blocks such that use of the memory blocks is evenly distributed. The memory controller may be configured to distribute use of the memory blocks such that a difference in an amount of use between memory blocks is reduced. The memory controller may be configured to track at least one of the erasures of the memory blocks and correction of errors in the data stored in the memory blocks, and may be configured to distribute use of the memory blocks based on the tracked erasures and correction of errors. The correction of errors may include the bit values of at least one memory block. The correction of errors may include the bit values of at least one row among rows of memory block.

According to example embodiments, the memory controller may be configured to allocate the memory blocks into at least two groups. The memory controller may be configured to distribute use of the memory blocks by allocating the memory blocks into at least two groups depending on a level of priority associated with each memory block, the level of priority associated with each memory block being assigned based on the erasures of the memory blocks and the errors in data stored in each memory block.

According to example embodiments, the memory controller may be configured to allocate the memory blocks into one of a high priority group, an intermediate priority group, and a low priority group depending on the level of priority associated with each of the memory blocks. The memory controller may be configured to initially allocate the memory blocks into the high priority group, and then into at least one of the intermediate priority group and the low priority group based on the erasures and the errors in data stored in each memory block. The memory controller may allocates a first memory block into the intermediate priority group when at least one of a number of 2-bit errors in the first memory block exceeds a first critical value and the number of erasures of the first memory block exceeds a threshold. The memory controller may allocate a first memory block into the low priority group when a number of 3-bit errors in the first memory block exceeds a second critical value.

In another example embodiment, the memory controller may include a processing unit, a buffer memory, and an ECC unit. The buffer memory may be configured to temporarily store data to be stored in or data read from a selected one of the plurality of memory blocks. The ECC unit may be configured to detect errors in data stored in the selected on of the plurality of memory blocks and transmit the error data to the processing unit.

In an example embodiment, a computer system may include a memory controller, a flash memory device, a microprocessor, and a user interface. The microprocessor may interact with the memory controller to store data in the flash memory. The user interface may control the actions of the microprocessor.

In an example embodiment of a wear leveling method, erasures and correction of errors of memory blocks may be stored according to use cycles. Use of the memory blocks may be distributed based on the stored erasures and correction of errors. The memory blocks may be allocated into at least two groups based on the stored erasures and correction of errors. Use of the memory blocks may be distributed according to the allocation of the memory blocks.

According to example embodiments, the at least two groups may include a high priority group, an intermediate priority group and a low priority group. Each memory block may initially be allocated to the high priority group, and then to one of the intermediate priority group or the low priority group based on at least one of the erasures or the correction of errors associated with the memory block. Each memory block may be allocated to the intermediate priority group when at least one of a number of 2-bit errors exceeds a first critical value and the number of erasures exceeds a threshold. Each memory block may be allocated to the low priority group when a number of 3-bit errors exceeds a second critical value. The correction of errors may include the bit values of at least one memory block. The correction of errors may include the bit values of at least one row among rows of memory blocks.

In another example embodiment, the memory system may include a flash memory device, and a memory controller. The flash memory device may include a plurality of memory units, each of the plurality of memory units including a plurality of memory cells. The memory controller may control the flash memory device. The memory controller may perform a wear-leveling operation on the memory units based on erase event information and ECC event information of each memory unit.

BRIEF DESCRIPTION OF THE FIGURES

The accompanying figures are included to provide a further understanding of example embodiments, and are incorporated in and constitute a part of this specification. In the figures.

DETAILED DESCRIPTION OF EXAMPLE EMBODIMENTS

Figure 1:
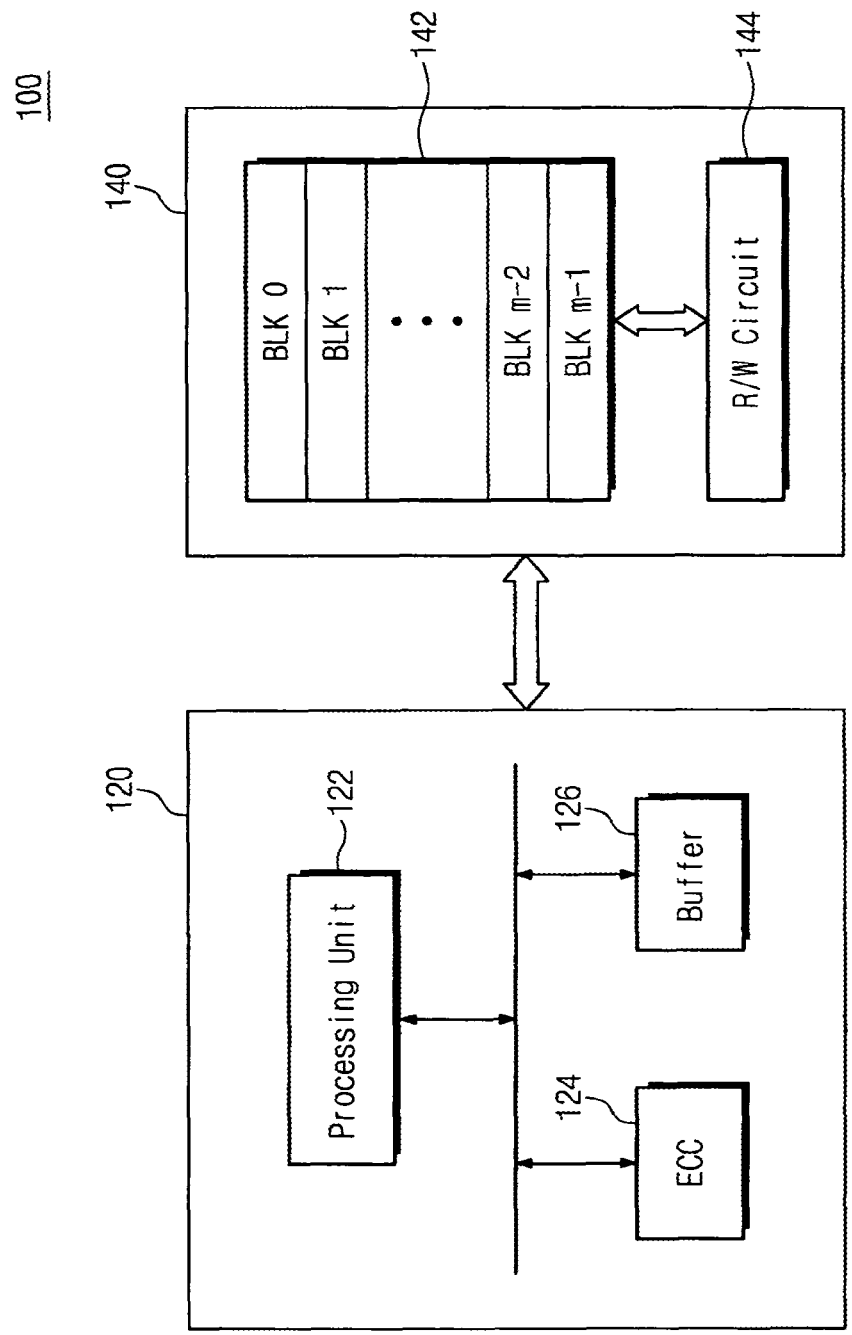
FIG. 1 is a block diagram of a memory system according to an example embodiment.

Example embodiments may be embodied in many different forms and should not be construed as being limited to the embodiments set forth herein; rather, these embodiments may be provided so that this disclosure will be thorough and complete, and will fully convey the concept of example embodiments to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A memory block (e.g., "memory unit," "sector") may include a plurality of memory cells and may constitute an erasable unit. For convenience of explanation, example embodiments use the term "memory block". It is apparent to those skilled in the art that the term "memory block" is not limited to a specific memory field.

An example embodiment of a memory system may include a flash memory device and a memory controller. The memory controller may include a processing unit, a buffer or buffer memory and an error checking and correction (ECC) unit. The buffer may be configured to temporarily store data read from a selected memory block. The ECC unit may be configured to detect errors and transmit error data to the processing unit.

FIG. 1 is a block diagram of a memory system according to an example embodiment. The memory system 100 may include a memory controller 120 and a flash memory system 140. The memory controller 120 may control the flash memory device 140 in response to an external request, for example, from a host. The memory controller 120 may include a processing unit 122, an error checking and correction (ECC) unit 124, and a buffer memory 126. The processing unit 122 may control general operations of the memory controller 120. The ECC unit 124 may generate ECC data based on the data stored in the flash memory device 140 based on whether data read from the flash memory device 140 has an error.

In one example, the ECC unit 124 may determine whether the data read from the flash memory device 140 has an error. If ECC unit 124 detects an error, the ECC unit 124 may notify the processing unit 122 of the detected error. The buffer memory 126 may temporarily store data to be stored in the flash memory device 140 or data read from the flash memory device 140. The buffer memory 126 may also store programs and/or mapping tables for managing the flash memory device 140.

The flash memory 140 device may include a plurality of memory blocks BLK0 through BLKm-1 and a read/write (R/W) circuit 144. Each of the memory blocks BLK0 through BLKm-1 may include a plurality of memory cells, for example, one or more arrays 142 of memory blocks BLK0 to BLKm-1. Each of the memory cells may have a transistor or similar structure storing charges. The R/W circuit 144 may perform a read/write operation on one or more selected memory blocks in response to a request from the memory controller 120.

The memory controller 120 may be configured to control the flash memory 140 such that use of the memory blocks is distributed based on erasures of the memory blocks and errors in data stored in the memory blocks. Use of the memory blocks may be distributed such that use of the memory blocks is more evenly or more uniformly distributed, or such that a difference in an amount of use between memory blocks is reduced. In an alternative example embodiment, the memory controller 120 may control the flash memory 140 such that use of the memory blocks is distributed based on errors in data stored in the memory blocks Still referring to the example embodiment in FIG. 1, the memory system 100 may distribute use of the memory blocks BLK0 to BLKm-1 of the flash memory device 140 (e.g., wear-leveling). For example, the memory system 100 may distribute use of the memory blocks BLK0 to BLKm-1 based on erase event information and/or ECC event information associated with each memory block. Erase event information may be indicative of the number of erasures of the memory blocks. ECC event information may be indicative of errors in data stored in the memory blocks.

An example embodiment of wear-leveling may track the number of times a memory block has been programmed and erased (erasures). However, such an approach may not accurately reflect the deterioration undertaken by a memory block because each memory block may have different erase/program characteristics. This difference in erase/program characteristics may make it relatively difficult to level the degree of deterioration of memory blocks.

Memory controller 120 may be configured to track at least one of the erasures of the memory blocks and correction of errors in the data stored in the memory blocks. Based on either the correction of errors or both correction of errors and erasures, memory controller 120 may distribute use of the memory blocks.

Still referring to the example embodiment shown in FIG. 1, the memory system 100 may manage the P/E cycling for each memory block by tracking erase event information and ECC event information for each memory block. The erase event information may include an erase event count (ERS_CNT), which counts each erasure a memory block. A separate erase event count ERS_CNT may be assigned to each memory block. The erase event count ERS_CNT may increase each time the associated memory block is erased.

Memory system 100 may also track the ECC event information of each block. In an example embodiment, the ECC event information may include two bit values assigned to each memory block. The first error bit value (EBN_2) of a memory block represents detection and correction of a two bit error. The first error bit value EBN_2 is set when the 2-bit error is corrected. The second error bit value (EBN_3) of a memory block represents detection and correction of a three bit error. The second error bit value EBN_3 is set when the 3-bit error is corrected. The first error bit value EBN_2 and the second error bit value EBN_3 may be two separate values and both may track the number of errors in a single memory block.

The erase event count ERS_CNT and the first and second error bit values EBN_2 and EBN_3 may be managed by processing unit 122 with the aid of a wear-leveling table stored in flash memory device 140. The wear-leveling table may be loaded into buffer memory 126 when the system is activated. When an erasure takes place in a memory block, processing unit 122 may update the wear-leveling table to increase the erase event count ERS_CNT for the selected memory block. If an error is detected in the data read from a memory block, ECC unit 124 may correct the error and provide an error bit value (as ECC data) to processing unit 122. Processing unit 122 may update the wear-leveling table to increase the first error bit value EBN_2 or the second error bit value EBN 3 according to the number of bits corrected by the ECC unit 124, as indicated by the ECC data. Through this method, the erase event count ERS_CNT and first and second error bit values (EBN_2 and EBN_3) may be managed by processing unit 122.

Figure 2:
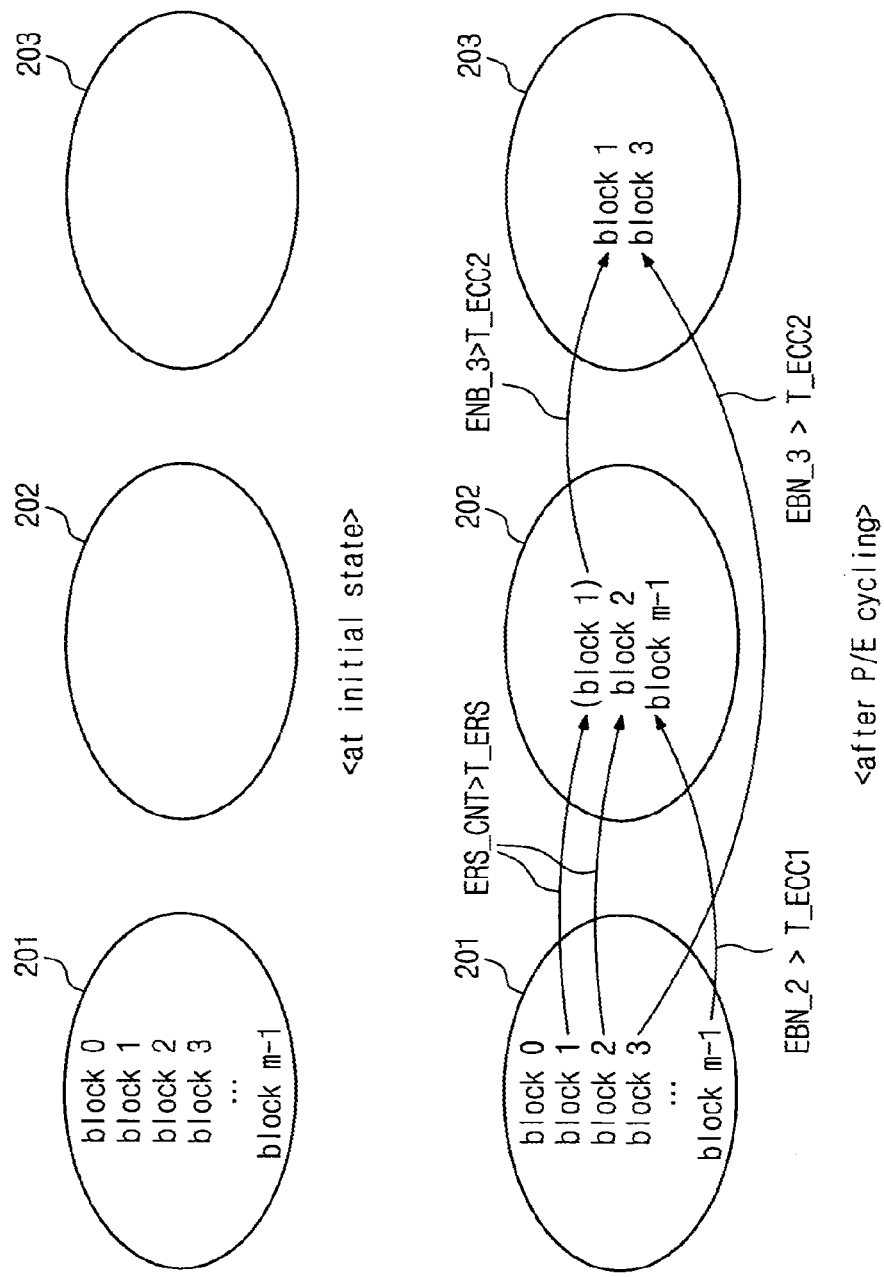
FIG. 2 is a view illustrating a wear-leveling method according to an example embodiment.

The memory system 100 may be configured to allocate the memory blocks into at least two groups. FIG. 2 illustrates an example embodiment in which, memory blocks BLK0 to BLKm-1 are allocated into the first group 201 as a default state or initial state. Each time a read/erase/program operation is performed, the erase event count ERS_CNT and the first and second error bit values EBN_2 and EBN_3 for each memory block may be increased. As the erase event count ERS_CNT and the first and second error bit values EBN_2 and EBN_3 for each memory block increase, the memory blocks BLK0 to BLKm-1 may be selectively allocated into the second group 202 or the third group 203.

FIG. 2 also illustrates an example allocation of memory blocks in a first group 201, a second group 202, and a third group 203. If the erase event count ERS_CNT exceeds an erase critical value T_ERS, or the first error bit value EBN_2 exceeds a first ECC critical value T_ECC1, the memory block associated with this erase event count ERS_CNT or first error bit value EBN_2 in the first group 201 may be allocated into the second group 202. If the second error bit value EBN_3 exceeds a second ECC critical value T_ECC2, the memory block associated with this second error bit value EBN_3 in the second group 202 may be allocated into the third group 203. If the second error bit value EBN_3 exceeds a second ECC critical value T_ECC2, the memory block associated with this second error bit value EBN_3 in the first group 201 may be allocated into the third group 203. According to example embodiments, when a program operation is requested, memory blocks in the first group 201 may be selected for the program operation before memory blocks in the second and third groups 202 and 203. Moreover, memory blocks in the second group 202 may be selected for programming before the memory blocks in the third group 203. By considering the number of erasures and error corrections of each memory block, deterioration of memory blocks may be leveled.

If the number of errors to be corrected in a selected memory block increases as the P/E cycling proceeds, the degree of deterioration of memory cells in the selected memory block may be relatively high. As a result, the memory blocks in the third group 203 may be managed to reduce and/or minimize their number of erasures. This may suppress rapid wearing of memory blocks with a significant number of error bits. By suppressing the wearing of error-prone memory blocks, the number of replacement memory blocks (relied upon when a memory unit goes bad, e.g., malfunctions or becomes inoperable) may be reduced. Thus, the net amount of usable memory units may be increased.

The first, second and third groups of memory blocks may be arranged depending on a level of priority. For example, a high priority group, an intermediate priority group, and a low priority group. All the memory blocks may be initially set into the high priority group. The high group may be the default group that indicates that the memory blocks assigned to that group have a relatively low number of erasures and/or errors. The memory blocks may also be assigned into at least one of the intermediate priority group and/or the low priority group based on at least one of the erasures or the correction of errors. For example, each memory block may be set into the intermediate priority group when at least one of a number of 2-bit errors exceeds a first critical value and the number of erasures exceeds a threshold. Furthermore, each memory block may be set into the low priority group when a number of 3-bit errors exceed a second critical value. The memory blocks assigned to the intermediate group have a lower priority than the memory blocks assigned high priority during memory allocation. Furthermore, memory blocks in the low priority group may have a lower priority than the high and intermediate priority groups during memory allocation. In this manner, the memory blocks having less erasures and/or errors are chosen first, according to their assigned priority.

Each memory block may be a single or group of memory cells. The correction of errors may include the bit values of at least one memory block or may include the bit values of at least one row among rows of memory cells in a memory block. For example, the erase event information may include the erase event count of each memory block. The ECC event information may include error bit values of at least one memory block among the memory blocks BLK0 to BLKm-1. Also, the ECC event information may include error bit values of at least one row among the rows of memory cells in a memory block. Each row may include a page, pages, or a word line.

Another example embodiment provides a wear-leveling method. The method may be implemented in and/or performed in conjunction with a memory controller and flash memory device. In this example embodiment, erasures and correction of errors of memory blocks may be stored according to use cycles. The use of memory blocks may be distributed by tracking the erasures and correction of errors.

Figure 3:
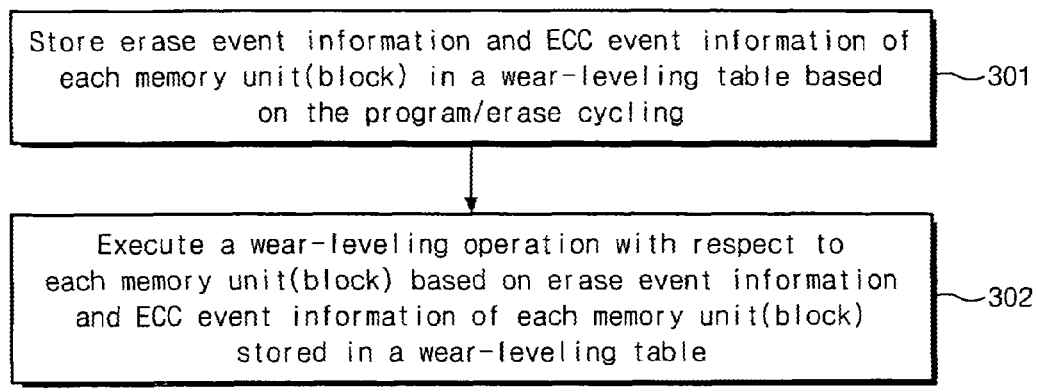
FIG. 3 is a flowchart illustrating a wear-leveling method of a memory system according to an example embodiment.

FIG. 3 is a flowchart illustrating an example embodiment of a wear-leveling method of a memory system.

The memory system may include a flash memory device. The flash memory device may include at least one memory unit that constitutes an erase unit. According to at least one example embodiment, at 301 erase event information of each memory block may be stored in the wear-leveling table according to program/erase cycling. At 302, a wear-leveling operation may be performed on each memory block based on erase event information and ECC event information stored in the wear-leveling table. According to at least one example embodiment, the wear-leveling operation may include prioritizing use of memory blocks.

The method may further include allocating the memory blocks into at least two groups. The two groups may be set depending on priority. In an example embodiment, the groups may include a high priority group, an intermediate priority group, and a low priority group. The memory blocks may be initially set into the high priority group. The high group may be the default group that indicates that the memory blocks assigned to that group have a relatively low number of erasures and errors. The memory blocks may thereafter be assigned into the intermediate priority group and/or low priority group based on at least one of the erasures and the correction of errors. The memory blocks assigned to the intermediate group have a lower priority than the memory blocks assigned to the high priority group during memory allocation. The memory blocks in the low priority group have a lower priority than the memory blocks in the intermediate and high priority groups. The memory blocks in the low priority group may be considered memory blocks of last resort during memory allocation relative to the memory blocks in the high and intermediate priority groups. In this manner, the memory blocks that have less erasures and errors may be chosen first, according to their assigned priority.

According to example embodiments, each memory block may be allocated to the intermediate priority group when at least one of a number of 2-bit errors exceed a first critical value and the number of erasures exceeds a threshold. Each memory unit may be allocated to the low priority group when a number of 3-bit errors exceeds a second critical value.

According to example embodiments, erase event information may include an erase event count for each memory block, and the ECC event information may include an error bit value for each memory block. The memory blocks may be initially allocated to the high priority group. Error bit values may include a first error bit value representing the 2-bit error event count and a second error bit value representing a 3-bit error event count. Each memory block may be allocated to the intermediate priority group when a first error bit value of each memory block is greater than a first ECC critical value. Each memory block in the intermediate priority group may be allocated to the low priority group when a second error bit value of each memory block is greater than a second ECC critical value.

In the example embodiment shown in FIG. 3, the erase event information may include the erase event count of each memory block. The ECC event information may include an error bit value of at least one memory block among the memory blocks. In another example embodiment of the wear-leveling method, the erase event information may include the erase event count of each memory block and the ECC event information may include error bit values of at least one row among the rows of memory blocks.

The flash memory device may be a non-volatile memory device retaining its stored data even when there is no power supply. As demands for mobile devices (e.g., mobile phones, personal digital assistants (PDAs), a digital cameras, portable game consoles, MP3 players, etc.) increase, the flash memory device may become widely used for data storage and/or code storage. Additionally, the flash memory device also may be applicable to home applications such as HDTV, DVD players, routers, GPS devices, etc.

Figure 4:
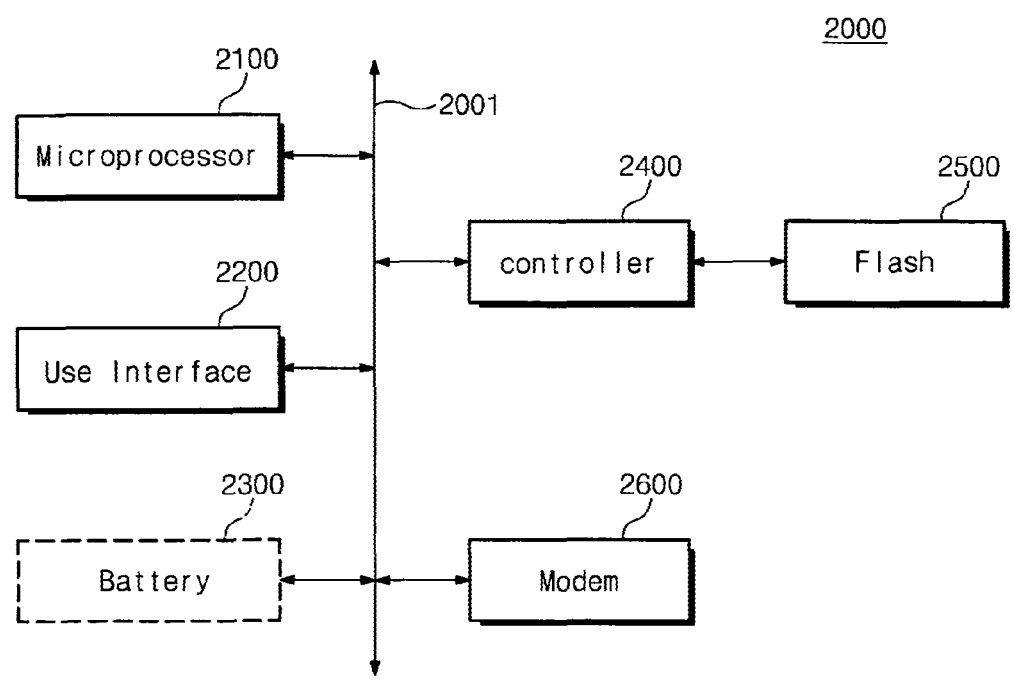
FIG. 4 is a block diagram illustrating a computing system with a memory system according to an example embodiment.

FIG. 4 is a block diagram of a computing system with a memory system according to an example embodiment. The computing system 2000 may include a microprocessor 2100, a user interface 2200, a modem 2600 (e.g., a baseband chipset), a memory controller 2400, and a flash memory device 2500. The components may be electrically connected via bus 2001.

In an example embodiment, the memory controller 2400 and the flash memory device 2500 may constitute a memory system having the same or substantially the same structure as the example embodiment shown in FIG. 1. The flash memory device 2500 may store N-bit data that may be processed by the microprocessor 2100 through the memory controller 2400 (N is an integer equal to or greater than 1). If the computing system 2000 is a mobile device, a battery 2300 may provide an operation voltage for the computing system 2000. Although not illustrated in the drawings, the computing system 2000 may further include other elements such as an application chipset, a camera image processor (CIS), a mobile DRAM, etc. It is also apparent that the flash memory device 2500 and the memory controller 2400 may be configured in the form of a memory card. For example, the memory controller 2500 and the flash memory device 2400 may constitute a solid state drive/disk (SSD) of a non-volatile memory for storing data.

The flash memory device 2500 and/or the memory controller 2400 of the example embodiment may be mounted through various forms of packages. These forms of packages include, but are no limited to: package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

It should be construed that foregoing general illustrations and following detailed descriptions are exemplified and an additional explanation of the claimed invention is provided.

Reference numerals are indicated in detail in example embodiments, and their examples are represented in the reference drawings. In every possible case, like reference numerals are used for referring to the same or similar elements in the description and drawings.

The above-disclosed subject matter is to be considered illustrative, and not restrictive, and the appended claims are intended to cover all such modifications, enhancements, and other embodiments, which fall within the true spirit and scope of example embodiments. Thus, to the maximum extent allowed by law, the scope of example embodiments is to be determined by the broadest permissible interpretation of the following claims and their equivalents, and shall not be restricted or limited by the foregoing detailed description.

What is claimed is:

1. A flash memory system comprising:
a memory controller configured to selectively allocate a plurality of memory blocks of a flash memory device among a plurality of groups of memory blocks such that,
from among the plurality of memory blocks, memory blocks having an erase count less than a threshold erase count are allocated to a first of the plurality of groups of memory blocks,
from among the plurality of memory blocks, memory blocks having an erase count greater than the threshold erase count are allocated to a second of the plurality of groups of memory blocks, and
from among the plurality of memory blocks, memory blocks having a number of errors in data greater than a threshold number of errors in data are allocated to a third of the plurality of groups of memory blocks;
wherein the first of the plurality of groups of memory blocks has a higher priority than the second and third of the plurality of groups of memory blocks, such that, in response to an external command from a host, memory blocks allocated to the first of the plurality of groups of memory blocks are utilized prior to memory blocks allocated to the second and third of the plurality of groups of memory blocks.

2. The memory system of claim 1, wherein the memory controller is configured to allocate at least a first of the plurality of memory blocks from the first of the plurality of groups of memory blocks to the second of the plurality of groups when the erase count for the first of the plurality of memory blocks exceeds the threshold erase count.

3. The memory system of claim 2, wherein the memory controller is further configured to allocate at least the first of the plurality of memory blocks from the second of the plurality of groups of memory blocks to the third of the plurality of groups of memory blocks when a number of errors in data associated with the first of the plurality of memory blocks exceeds the threshold number of errors in data.

4. The memory system of claim 1, wherein the memory controller is configured to allocate at least a first of the plurality of memory blocks from the first of the plurality of groups of memory blocks to the third of the plurality of groups of memory blocks when a number of errors in data associated with the first of the plurality of memory blocks exceeds the threshold number of errors in data.

5. The memory system of claim 1, wherein the memory controller is configured to allocate at least a first of the plurality of memory blocks from the second of the plurality of groups of memory blocks to the third of the plurality of groups of memory blocks when a number of errors in data associated with the first of the plurality of memory blocks exceeds the threshold number of errors in data.

6. The memory system of claim 1, wherein the second of the plurality of groups of memory blocks has a higher priority than the third of the plurality of groups of memory blocks, such that, in response to an external command from a host, memory blocks allocated to the second of the plurality of groups of memory blocks are utilized prior to memory blocks allocated to the third of the plurality of groups of memory blocks.

7. The memory system of claim 1, further comprising:
the flash memory device including the plurality of memory blocks, each of the plurality of memory blocks including at least one memory cell.

8. The memory system of claim 7, wherein the flash memory device and the memory controller constitute a solid state drive (SSD).

9. A computing system comprising:
the memory system of claim 1; and
a microprocessor configured to interact with the memory controller to store data in the flash memory device.

10. A memory system comprising:
a memory controller configured to,
    allocate at least a first of a plurality of memory blocks of a flash memory device from a first group of memory blocks to a second group of memory blocks based on a number of erasures of the first of the plurality of memory blocks,
    allocate at least a second of the plurality of memory blocks from the first group of memory blocks to a third group of memory blocks based on a number of errors in data associated with the second of the plurality of memory blocks, and
    allocate at least a third of the plurality of memory blocks from the second group of memory blocks to the third group of memory blocks based on a number of errors in data associated with the third of the plurality of memory blocks;
wherein the first group of memory blocks has a higher priority than the second and third groups of memory blocks, such that, in response to an external command from a host, memory blocks allocated to the first group of memory blocks are utilized prior to memory blocks allocated to the second and third groups of memory blocks.

11. The memory system of claim 10, wherein the second group of memory blocks has a higher priority than the third group of memory blocks, such that, in response to an external command from a host, memory blocks allocated to the second group of memory blocks are utilized prior to memory blocks allocated to the third group of memory blocks.

12. The memory system of claim 10, wherein the memory controller is further configured to allocate at least the first of the plurality of memory blocks from the first group of memory blocks to the second group of memory blocks when the number of erasures of the first of the plurality of memory blocks exceeds a threshold number of erasures.

13. The memory system of claim 10, wherein the memory controller is further configured to allocate at least the second of the plurality of memory blocks from the first group of memory blocks to the third group of memory blocks when the number of errors in data associated with the second of the plurality of memory blocks exceeds a threshold number of errors in data.

14. The memory system of claim 13, wherein the memory controller is further configured to allocate the third of the plurality of memory blocks from the second group of memory blocks to the third group of memory blocks when the number of errors in data associated with the third of the plurality of memory blocks exceeds the threshold number of errors in data.

15. The memory system of claim 10, wherein the memory controller is further configured to allocate the third of the plurality of memory blocks from the second group of memory blocks to the third group of memory blocks when the number of errors in data associated with the third of the plurality of memory blocks exceeds a threshold number of errors in data.

16. The memory system of claim 10, further comprising:
the flash memory device including the plurality of memory blocks, each of the plurality of memory blocks including at least one memory cell.

17. The memory system of claim 16, wherein the flash memory device and the memory controller constitute a solid-state drive (SSD).

18. A computing system comprising:
the memory system of claim 10; and
a microprocessor configured to interact with the memory controller to store data in the flash memory device.

* * * * *